US006566639B1

(12) United States Patent
Figueira

(10) Patent No.: US 6,566,639 B1
(45) Date of Patent: May 20, 2003

(54) SYSTEM, METHOD AND APPARATUS FOR DATA STORAGE USING AN OPTICAL MEDIUM

(75) Inventor: Norival R. Figueira, San Jose, CA (US)

(73) Assignee: Nortel Networks Limited, St. Laurent (CA)

( * ) Notice: Subject to any disclaimer, the term of this patent is extended or adjusted under 35 U.S.C. 154(b) by 139 days.

(21) Appl. No.: 09/935,819

(22) Filed: Aug. 23, 2001

(51) Int. Cl.[7] .................................................. G02B 7/04
(52) U.S. Cl. .............................. 250/201.5; 250/227.11
(58) Field of Search ........................... 250/201.5, 206, 250/214 R, 214.1, 216, 227.11, 227.24, 227.12; 385/24, 8, 12; 359/118, 119, 152, 187

(56) References Cited

U.S. PATENT DOCUMENTS 6,173,093 B1 * 1/2001 Jeal .............................. 385/24

* cited by examiner

Primary Examiner—Que T. Le

(57) ABSTRACT

A system, method and apparatus for storing data using an optical medium. The medium is initialized and data is inserted into the medium, read from the medium and reinserted into the medium. Queues, random access storage devices and other similar structures are formed according to this technique.

29 Claims, 3 Drawing Sheets

SYSTEM, METHOD AND APPARATUS FOR DATA STORAGE USING AN OPTICAL MEDIUM

FIELD OF THE INVENTION

The present invention relates to systems, devices and methods for data storage using optical media, and, more particularly, to storing information in structures, such as queues, using an optical medium.

BACKGROUND OF THE INVENTION

Optical fibers have become key elements in data communication systems and networks when the data rate exceeds several tens of megabits per second or distances exceed several kilometers. As the demand for higher bandwidths continues, data communication systems and networks will be implemented increasingly using optical transmission techniques. This trend will be facilitated by the availability of components that store data using optically transmissive media. The operation of optical networks is described in Rajiv Ramaswarni and Kumar N. Sivarajan, "Optical Networks: A Practical Perspective," (1998), which is incorporated herein in its entirety.

SUMMARY OF THE INVENTION

In an embodiment of the invention, data is stored as an optical signal in a loop formed from an optically transmissive medium. Data is inserted into the medium and data that has traversed the medium is reinserted into the medium. Additional data can be inserted into the loop in any order. Data stored in the loop can be rearranged or deleted. By controlling the manner in which data is stored in the loop, the loop can be made to operate as different types of storage, such as a first-in-first-out queue or random access storage. Amplification/regeneration of the optical signals is performed as needed to maintain the data in the loop.

In a further embodiment of the invention an initializing signal is inserted into a medium by an optical controller. The initializing signal may be an idle pattern or any other pattern that permits the optical controller to identify specific portions of the data stream in the optical signal traversing the medium. Once initialized, the system may be used to form one of a variety of data storage structures.

In another embodiment of the present invention, the controller forms a first-in-first-out queue in the medium by writing a start-of-queue marker and then an end-of-queue marker. Data is inserted into the queue by overwriting the end-of-queue marker and then writing the packet followed by a new end-of-queue marker. Data is removed from the queue by overwriting the start-of-queue marker and first packet with an idle pattern and then writing a new start-of-queue marker.

In a further embodiment of the invention, a controller initializes an optically transmissive medium by inserting a signal that divides the data stream in the medium into a plurality of sectors, with each sector a fixed length. Each of the sectors is characterized by a plurality of offset points for data in the sector. The controller both inserts data into the medium and reads data from the medium by selecting an offset point within a sector. This embodiment advantageously provides random access to the data stream in the optically transmissive medium.

BRIEF DESCRIPTION OF THE DRAWINGS

The invention will be more readily understood by reference to the following description, taken with the accompanying drawings, in which.

DETAILED DESCRIPTION OF SPECIFIC EMBODIMENTS

In an embodiment of the invention, data is stored as an optical signal in a loop formed from an optically transmissive medium. Data is inserted into the medium and data that has traversed the medium is reinserted into the medium. Additional data can be inserted into the loop in any order. Data stored in the loop can be rearranged or deleted. By controlling the manner in which data is stored in the loop, the loop can be made to operate as different types of storage, such as random access storage or as a first-in-first-out queue. For example, an initializing signal can be inserted into the loop, dividing the data stream in the loop into fixed length sectors. Data can be randomly inserted and read at offset points within the sectors forming a random access storage system. Amplification/regeneration of the optical signals is performed as needed to maintain the data in the loop.

The optically transmissive medium can be any material capable of transmitting an optical signal, including, without limitation, optical fiber, air, another gas, a solid material, for example, a semiconductor or a liquid material. The medium may include mirrors or other devices that can guide signals in an optically transmissive material.

A number of factors affect the amount of data that can be stored in the system together with the latency for retrieving data from the system. For example, the storage capacity of the system depends on the transit time of the optical data signal through the medium which, in turn, depends on such factors as the material used for the medium; the physical dimensions of the medium, particularly the length of the medium from first end to second end; and the refractive index profile of the medium. The refractive index profile of the medium will depend on physical parameters for the medium, such as ambient temperature, ambient pressure, superimposed electromagnetic fields and the like. The storage capacity of the system will also depend on the data rate and coding scheme used for the optical data signal. The transit time of the optical signal through the medium also determines how quickly data can be read from the medium, after the data has been inserted into the medium, i.e., the latency of data access. The transit time for the data through the loop will also determine the latency to insert new data into a particular location in the data stream in the medium.

Figure 1:
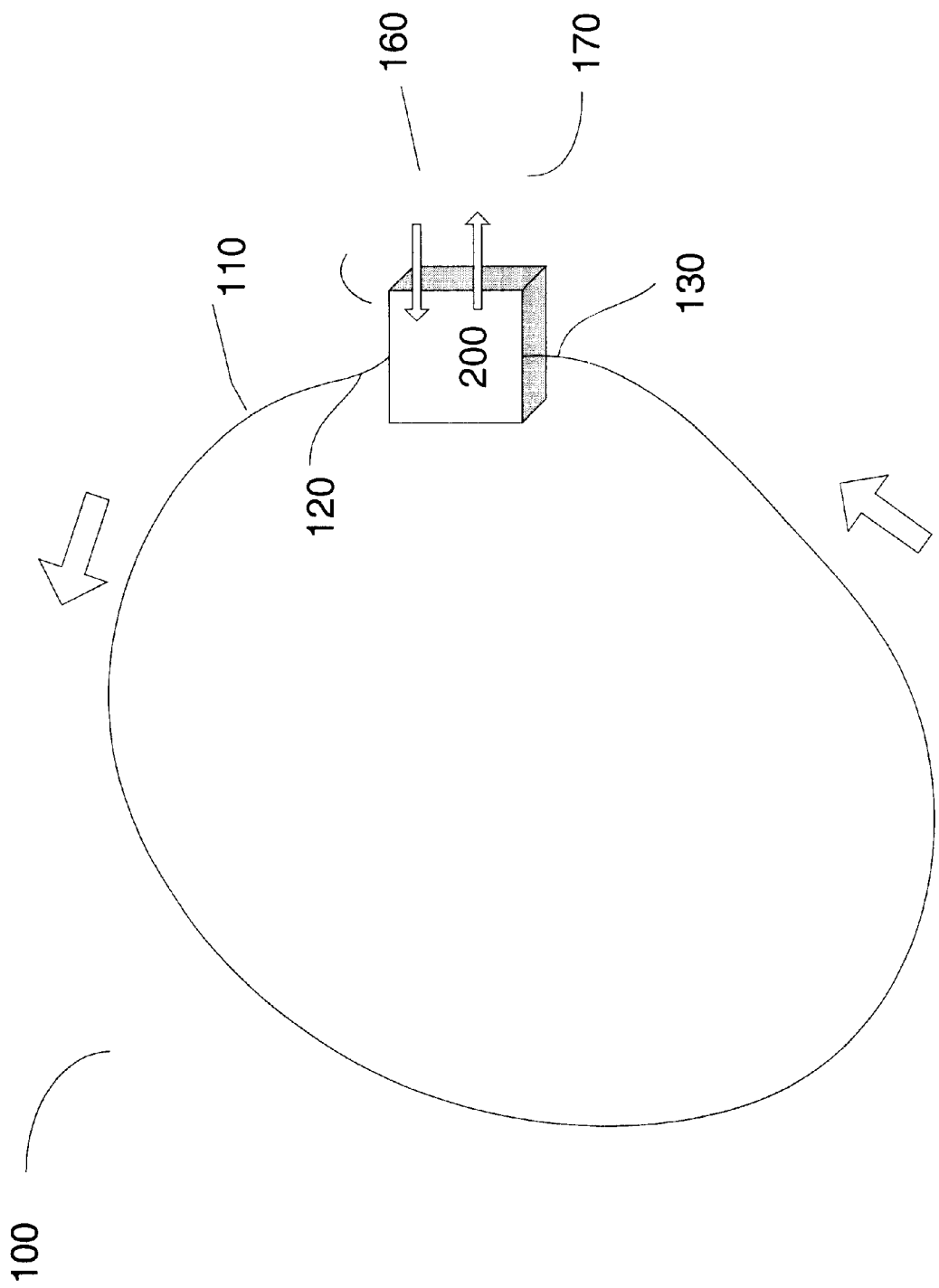
FIG. 1 shows a data storage system using an optically transmissive medium formed into a loop.

FIG. 1 shows an exemplary storage system 100 employing an optically transmissive medium 110 according to an embodiment of the present invention. An optical controller 200 inserts data into the first end of the medium 120 that was input to the system at an input port 160. Data is read from the medium at the second end 130 by the controller and output from the system at an output port 170. Controller 200 also reinserts the data read from the second end of the medium into the first end of the medium, forming a complete loop. The controller 200 amplifies the received optical signal to compensate for losses in the optical medium. The controller may also perform signal restoration, such as restoring signal shape, restoring timing relationships or reducing jitter. Amplification or restoration can be done in the optical domain or electronically or by a combination of both techniques.

The controller 200 determines the manner in which data is inserted into the medium in a "data stream." The controller can rearrange data in the medium 110 by reading the data and reinserting the data at a different location in the data stream. The controller can delete data from the data stream. The controller can initialize the data stream with a distinctive pattern, such as an idle pattern. The controller can insert control characters, such as start-of-queue and end-of-queue markers, into the data stream to form a variety of data structures using the medium. The controller can keep track of the capacity of the medium and prevent data overflows. The controller can format the entire data stream in the medium with a pattern that divides the medium into fixed length sectors and data can be inserted and retrieved with reference to an offset point in a sector.

Figure 2:
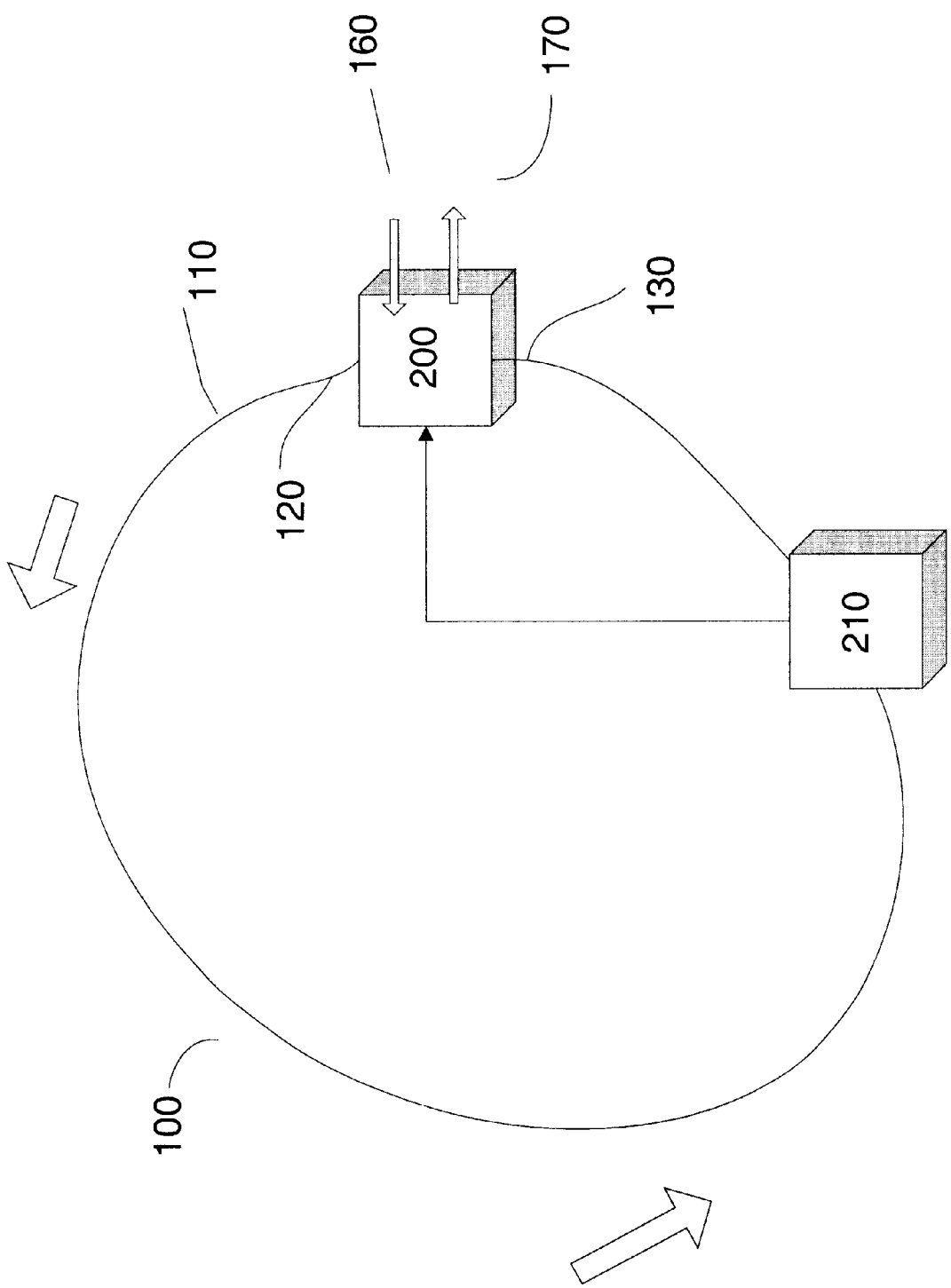
FIG. 2 shows a data storage system that employs a second controller to avoid data overrun in a data storage queue.

In a specific embodiment, data queues, such as first-in-first-out queues, may be formed in the medium 110 in the system 100, as shown in FIG. 1. Initialization may further include writing a start-of-queue ("SOQ") marker and an end-of-queue ("EOQ") marker into the medium to identify the beginning and end of a queue. An empty queue is identified by adjacent SOQ and EOQ markers in the data stream. A data packet is enqueued by inserting the data into the data stream so as to overwrite the EOQ marker and appending an EOQ marker to the end of the data packet. Logic in the optical controller 200 avoids queue overflow by keeping track of the volume of data as the data is inserted into the medium. Alternatively, in a specific embodiment of the invention, a second optical controller 210 is provided, as shown in FIG. 2. This second optical controller 210 is placed "up stream" of the first optical controller 200. The second optical controller 210 reads the data stream and logic in the second optical controller alerts the first controller 200 that the SOQ marker is arriving so that the first controller can avoid queue overflow. Logic in the controller 200 removes a packet from the queue by overwriting both the SOQ marker and the data packet with an idle pattern and then writing a new SOQ marker to the medium.

Figure 3:
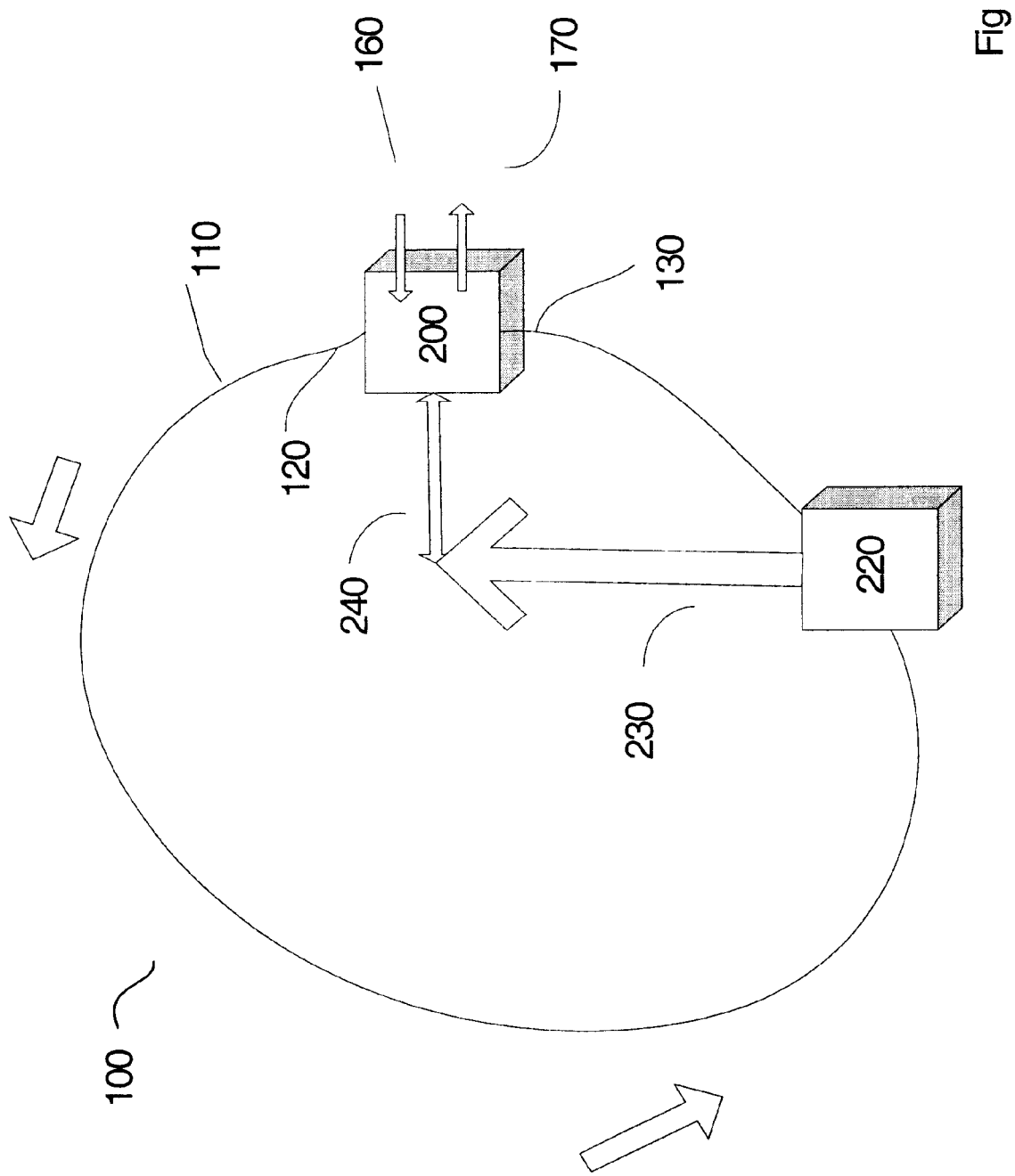
FIG. 3 shows a data storage system according to an embodiment of the invention that employs a delay line for packet insertion into a queue.

In another embodiment of the invention, as shown in FIG. 3, a second controller 220 and a delay line 230 are used to facilitate inserting a packet between two adjacent packets in the data stream. An optical controller 200 inserts data into the first end of the medium 120 that was input to the system at an input port 160 and reinserts data read from the second end of the medium into the first end of the medium. Controller 200 also reads data from the medium and outputs the data at output port 170. Controller 220 is positioned upstream of the first controller 200. Controller 220 reads the data stream from the medium and couples the data stream into a delay line 230. Controller 200 inserts the new data packet into the data stream after the end of the first packet in the data stream has been reinserted into the medium. Controller 200 then begins inserting data from the delay line 230 into the data stream, as received via a port 240. If the packet to be inserted is shorter than the delay line storage time, controller 200 inserts an idle pattern at the end of the new packet so as to make up the difference. Once the end of the queue has been reinserted into the medium by controller 200, as received from delay line 230, logic in controller 200 reverts to reinserting data into the medium as received from the second end of the medium 140. The packet insertion operation is then complete.

In a further embodiment of the invention, the controller 200 of the storage system 100, as shown in FIG. 1, initializes the medium 110 by inserting a signal that divides the medium into a plurality of sectors, with each sector a fixed length. Each of the sectors is characterized by a plurality of offset points for data in the sector. Controller 200 both inserts data into the medium and reads data from the medium by selecting an offset point within a sector. This embodiment advantageously provides random access to the data stream in the medium. In a specific embodiment, a data storage medium may include multiple optical controllers, connected at a plurality of points in the medium. The provision for multiple controllers can advantageously reduce the latency for reading data from the medium or inserting data into the medium. According to a further specific embodiment, data is written into the medium using error detecting/correcting coding, according to any coding method known in the art. Errors in the data read from the optical medium can be advantageously detected and corrected.

In a specific embodiment of the invention, the storage capacity and data latency time of the storage system 100 may be configured by varying the transit time of the optical signal through the medium. For example, the transit time of data through the medium may be configured by changing the medium's dimensions, such as the medium's length; altering the path length through the medium using mirrors; or altering physical parameters characterizing the medium, such as pressure, temperature, and electromagnetic fields imposed on the medium. Changes in the transmission path length can be effected by the use of mirrors.

The functions of inserting data into the medium, reading data from the medium and reinserting the data into the medium may be performed in a specific embodiment by a plurality of optical controllers with any of these functions or a combination of these functions performed by each or any of the plurality of controllers. Similarly, the functions of inputting data to the system and outputting data from the system may be performed by any combination of a plurality of controllers. In a specific embodiment, a controller may be operatively connected to the medium at any given point within the medium. In a specific embodiment, the medium may be divided into a plurality of segments, the segments connected by controllers.

A medium, as used in this specification and any appended claims, can be any material capable of transmitting an optical signal, including, without limitation, optical fiber, air, another gas, a solid material, for example, a semiconductor, a liquid material, or mirrors guiding signals coupled with an optically transmissive material.

The present invention may be embodied in many different forms, including, but in no way limited to, computer program logic for use with a processor (e.g., a microprocessor, microcontroller, digital signal processor, or general purpose computer), programmable logic for use with a programmable logic device (e.g., a Field Programmable Gate Array (FPGA) or other PLD), discrete components, integrated circuitry (e.g., an Application Specific Integrated Circuit (ASIC)), or any other means including any combination thereof. In a typical embodiment of the present invention, predominantly all of the controller logic is implemented as a set of computer program instructions that is converted into a computer executable form, stored as such in a computer readable medium, and executed by a microprocessor within the array under the control of an operating system.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an opal memory device (e.g., a CD-ROM), a PC card (e.g., PCMCIA card), or other memory device.

Hardware logic (including programmable logic for use with a programmable logic device) implementing all or part of the functionality previously described herein may be designed using traditional manual methods, or may be designed, captured, simulated, or documented electronically using various tools, such as Computer Aided Design (CAD), a hardware description language (e.g., VHDL or AHDL), or a PLD programming language (e.g., PALASM, ABEL, or CUPL.)

The present invention may be embodied in other specific forms without departing from the true scope of the invention. The described embodiments are to be considered in all respects only as illustrative and not restrictive.

What is claimed is:

1. A method for storing data in optical form, the method comprising:
   initializing an optical medium;
   inserting data into the medium;
   reading data from the medium; and
   reinserting data that traverses the medium into the medium.

2. A method as in claim 1, wherein initializing the medium includes inserting an idle pattern into the medium.

3. A method as in claim 1, wherein initializing the medium includes inserting into the medium a start-of-queue marker followed by an end-of-queue marker.

4. A method as in claim 3, wherein inserting data includes:
   writing data into the medium over the end-of-queue marker; and
   writing a new end-of-queue marker into the medium after the data.

5. A method as in claim 4, wherein inserting data further includes reading data from the medium upstream of a data insertion point to prevent queue overflow.

6. A method as in claim 3, further including:
   deleting data by overwriting the start-of-queue marker and inserting a new start-of-queue marker into the medium over the end of the data to be deleted.

7. A method as in claim 1 wherein initializing an optical medium includes dividing the medium into a plurality of sectors, each sector capable of containing a fixed amount of data, each sector characterized by a plurality of offset positions within the sector.

8. A method as in claim 7, wherein inserting data includes identifying a given offset position in a given sector, the data inserted at the given position.

9. A method as in claim 8 wherein reading data from the medium includes reading at the given offset position in the given sector.

10. A method as in claim 1 wherein reading data from the medium further includes employing error detection techniques.

11. A method as in claim 1 wherein reading data from the medium includes reading data at each of a plurality of points in the medium.

12. A method as in claim 1 wherein inserting data includes inserting data at each of a plurality of points in the medium.

13. A method as in claim 1 wherein the optical medium includes a mirror.

14. A method as in claim 1 wherein the optical medium includes optical fiber.

15. A method as in claim 1 further comprising varying a physical parameter for the medium thereby changing the data storage capacity of the medium.

16. A method as in claim 1 wherein reinserting data includes regeneration of an optical signal associated with the data.

17. A method according to claim 2 wherein
   inserting data into the medium includes,
      suspending reinserting data;
      reading given data from the medium;
      inserting new data into the medium;
      reinserting the given data into the medium; and
      then resuming reinserting data read from the medium into the medium.

18. A method according to claim 17, wherein reading given data from the medium further includes storing the given data in an optical delay line.

19. An optical storage system comprising:
   an optical medium having a first end and a second end; and
   an optical controller operatively coupled to insert an initializing signal into the first end of the optical medium, to insert data into the first end, to read data received at the second end of the optical medium, and to reinsert data received from the second end into the first end.

20. A system according to claim 19, wherein logic to insert an initializing signal further includes inserting into the medium a start-of-queue marker followed by an end-of-queue marker.

21. A system according to claim 19, wherein the initializing signal divides the medium into fixed sized sectors, the sectors characterized by a plurality of offset positions.

22. A system according to claim 21, wherein the controller further includes logic to read data from the medium from a given offset position in a given sector.

23. A system according to claim 19, wherein the medium includes optical fiber.

24. A system according to claim 19, wherein the medium includes a mirror.

25. A system according to claim 19, wherein the transit time for data through the medium is configurable.

26. A system according to claim 19, wherein the controller regenerates an optical signal associated with the data reinserted into the medium.

27. A controller for storing data in an optical medium, the controller comprising:
   a receiver for receiving data from the medium;
   a transmitter for inserting data into the medium;
   logic to reinsert data received from the medium into the medium; and
   logic to insert an initializing signal into the medium.

28. A controller according to claim 27, wherein the initializing signal divides the medium into fixed sized sectors, the sectors characterized by a plurality of offset positions.

29. A controller according to claim 27 further comprising logic to insert a start-of-queue marker followed by an end-of-queue marker into the medium.

* * * * *